(12) United States Patent
Kazama

(10) Patent No.: US 6,556,033 B1
(45) Date of Patent: *Apr. 29, 2003

(54) ELECTROCONDUCTIVE CONTACT UNIT ASSEMBLY

(75) Inventor: Toshio Kazama, Nagano (JP)

(73) Assignee: NHK Spring Co., Ltd., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/743,534

(22) PCT Filed: Jul. 9, 1999

(86) PCT No.: PCT/JP99/03713

§ 371 (c)(1),
(2), (4) Date: Mar. 12, 2001

(87) PCT Pub. No.: WO00/03250

PCT Pub. Date: Jan. 20, 2000

(30) Foreign Application Priority Data

Jul. 10, 1998 (JP) .............................. 10-196214

(51) Int. Cl.[7] ................................................ G01R 1/04
(52) U.S. Cl. ........................................ 324/761; 324/754
(58) Field of Search ................................ 324/754, 755, 324/765, 761, 762; 439/482

(56) References Cited

U.S. PATENT DOCUMENTS 4,931,726 A * 6/1990 Kasukabe et al. .......... 439/482

6,337,572 B1 * 1/2002 Kazama ..................... 324/754

FOREIGN PATENT DOCUMENTS

| JP | 3-202780 | 9/1991 |
| JP | 6-148236 | 5/1994 |
| JP | 6-317624 | 11/1994 |
| JP | 7-225245 | 8/1995 |

* cited by examiner

Primary Examiner—Vinh P. Nguyen
(74) Attorney, Agent, or Firm—MacPherson Kwok Chen & Heid LLP

(57) ABSTRACT

An electroconductive contact unit which includes needle member guide holes formed in a plate made of high strength material such as metallic materials. The mechanical strength of the parts of the holder defining the needle member guide holes are increased in mechanical strength so that the positional precision of the tip of each electroconductive needle member can be improved. Forming an insulating film over the inner circumferential surface of each needle member guide hole, which guides the corresponding needle member, allows the needle member to be slidably disposed therein without breaking insulation. When the plate is made of electroconductive material, and an insulating film is formed over the outer surface of the holder as well as over the inner circumferential surface of each through hole, which guides the needle member and receives a coil spring therein, by grounding the plate, the electroconductive needle member and the compression coil spring inside each through hole are electromagnetically shielded, making them immune to noises.

8 Claims, 4 Drawing Sheets

ELECTROCONDUCTIVE CONTACT UNIT ASSEMBLY

TECHNICAL FIELD

The present invention relates to an electroconductive contact unit assembly which allows the positional precision of the tip of each contact unit to be improved, and is suitable for use in a high frequency probe.

BACKGROUND OF THE INVENTION

Conventionally, a plurality of electroconductive contact units are arranged so as to form a test unit adapted to simultaneously access multiple points for testing semiconductor products. Such a test unit requires a large number of component parts and the assembly work of the test units tends to be highly complex because a plurality of contact probe units, each consisting of a tubular holder and an electroconductive contact unit received therein, have to be mounted on a support plate one by one. To eliminate such a problem, it has been proposed to laminate a plurality of plastic insulating plates having a plurality of through holes passed across their thickness, and slidably receive an electroconductive needle member in each through hole. The holes of the outer insulating plates are dimensioned to be smaller than those in the middle insulating plates so that a coil spring may be received in each through hole, and resiliently urge the corresponding electroconductive needle member in the outward direction.

In recent years, the need has been created to arrange hundreds and thousands of contact units in a small area, for instance in the order of 10 mm square, due to an increasingly higher level of integration found in semiconductor products that are required to be tested. In case of an electroconductive contact unit using a plastic material for the insulating plates of the holder, the mechanical strength may become inadequate when a large number of holes are formed in a small area, and this may cause a warping of the insulating plates which in turn causes the positional errors in the free ends of the individual electroconductive contact units.

Also, when the electroconductive part of each contact unit is subjected to external noises, it may affect the waveform of the signal that is received from the object to be contacted. Additionally, with the use of increasingly higher frequencies in semiconductor chips, the high frequency signal which is conducted through each contact unit may become a source of noises for external devices.

BRIEF SUMMARY OF THE INVENTION

To eliminate such a problem, the present invention provides an electroconductive contact unit assembly, comprising a holder for guiding an electroconductive needle member for contacting an object so as to be axially moveable into and out of a through hole, and a compression coil spring received in the through hole coaxially with respect to the electroconductive needle member so as to resiliently urge the electroconductive needle member out of the through hole, characterized by that: the holder comprises at least one plate member made of material having a high mechanical strength; and the through hole comprises a needle member guide hole for guiding the electroconductive needle member, and a retaining shoulder for retaining the electroconductive needle member therein against a spring force of the compression coil spring; the needle member guide hole being formed in the plate member, and being in turn formed with an insulating film on an inner circumferential surface thereof.

Thus, because the needle member guide hole is formed in the plate member made of high strength material such as metal, it is possible to ensure a sufficient mechanical strength to the part of the holder provided with the needle member guide holes, and thereby prevent the warping of the plate member so that the positional accuracy of the electroconductive needle members can be ensured. Even when the high mechanical strength material consists of readily available electroconductive metal, the necessary insulation can be effected by forming an insulating film between each electroconductive needle member and the corresponding through hole in spite of the sliding contact between the electroconductive needle member and the needle guide hole.

If only one electroconductive needle member is provided on one end of the compression coil spring for each contact unit, the overall structure of the contact unit can be simplified.

If a pair of electroconductive needle members are provided each on the corresponding end of the compression coil spring for each contact unit, the contact unit can be given with moveable ends at both ends so that the contact unit can be placed between two objects to be contacted (a circuit board to be tested and a testing circuit board, for instance) for conducting the desired testing and measurement.

If the holder comprises a plurality of electroconductive plate members which are laminated one over another, and the inner circumferential surface of the through hole is formed with an insulating film, the plate members forming the needle member guide hole can be processed individually.

By grounding the electroconductive holder or the plate member, the electroconductive member and compression coil spring received in the through hole can be electromagnetically shielded, and are therefore protected from noises.

If the retaining shoulder is formed in an insulating film, even when the needle member guide hole is formed in a high mechanical strength material such as metal, the retaining shoulder may be formed in the insulating film while the through hole is formed as a straight hole in the plate member. Because the retaining shoulder can be made in a relative soft part, the process of forming the retaining shoulder is simplified.

If a pair of plate members made of high mechanical strength material are placed on either side of the holder, and a plate member made of plastic material is interposed between the plate members made of the high mechanical strength material, the weight of the assembly can be minimized in spite of the use of the metallic plate members. In particular, by receiving the compression coil spring in the part of the through hole formed in the plastic member, the plastic member is not required to be processed at any high precision, and the work involved in forming the through hole is simplified.

The features and advantages of the present invention will become apparent from the following description with reference to the appended drawings.

DETAILED DESCRIPTION OF THE PREFERRED EMBODIMENTS

Preferred embodiments of the present invention are now described in the following with reference to the appended drawings.

Figure 1:
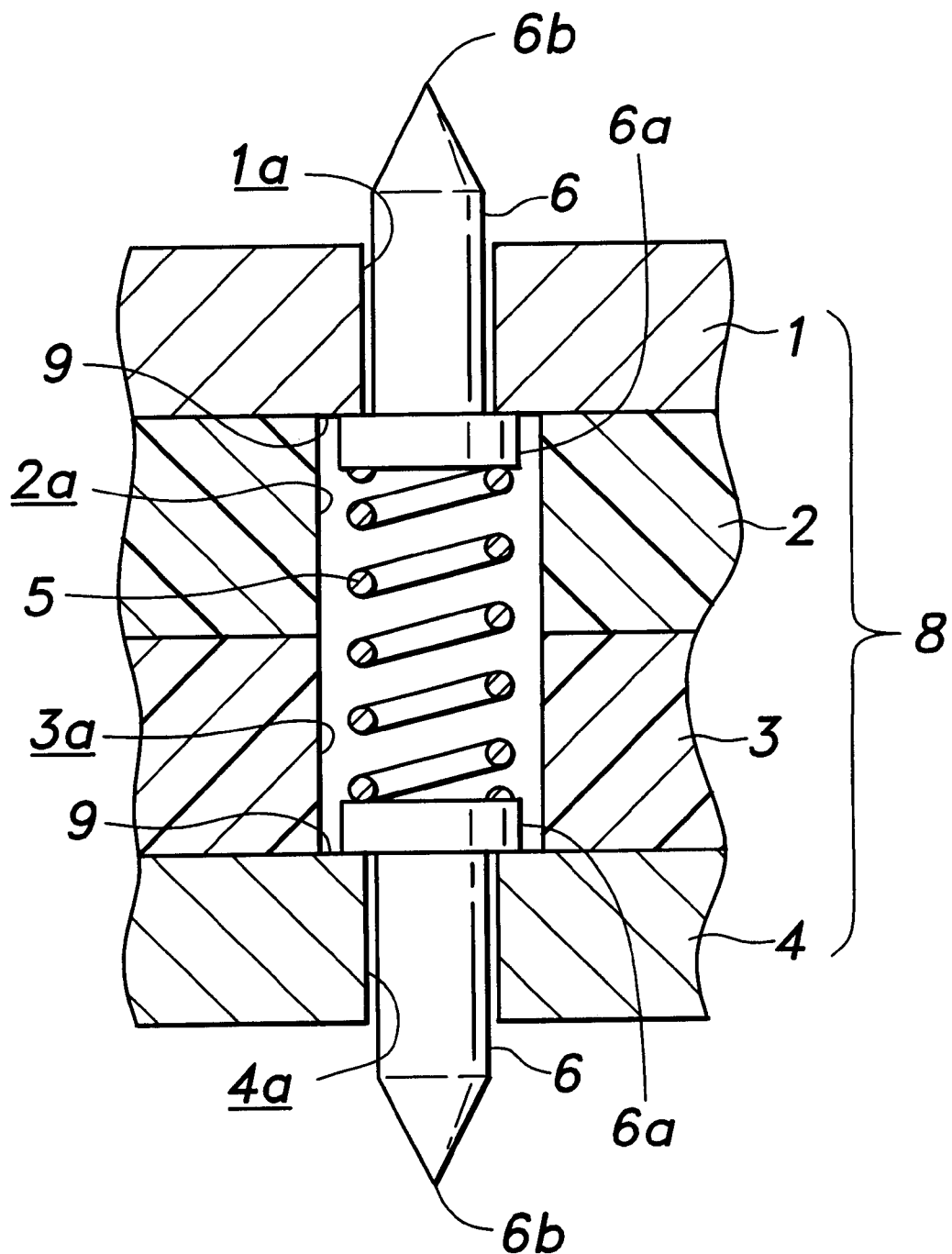
FIG. 1 is a partly broken-away fragmentary vertical sectional view of an essential part of a test unit for semiconductor products embodying the present invention.

FIG. 1 is a partly broken-away fragmentary vertical sectional view of an essential part of a test unit for semiconductor products embodying the present invention. In this drawing, a support block 8 is formed by laminating four plate members 1 to 4. The two middle plate members 2 and 3 of these four laminated plate members are formed with coil spring support holes 2a and 3a having a relatively large diameter, and the two outer plate members 1 and 4 interposing the middle plate members 2 and 3 are formed with needle member guide holes 1a and 4a having a relatively small diameter, all in a coaxial relationship. A holder is thus constructed by forming the through hole consisting of the coil spring support holes 2a and 3a and needle member guide holes 1a and 4a in the support block 8 formed by laminating the plate members 1 to 4.

The compression coil spring 5 is received in the coil spring support holes 2a and 3a in a coaxial relationship. The needle member guide holes 1a and 4a each support an electroconductive needle member 6 in an axially slidable and coaxial relationship.

Each electroconductive needle member 6 is supported by the corresponding needle member guide hole 1a or 4a at a middle part thereof, and comprises an external flange portion 6a in a part thereof received in the coil spring support hole 2a or 3a, and a pointed conical needle tip portion 6b projects outward from the corresponding needle guide hole 1a or 4a with its pointed end first.

A compression coil spring 5 is interposed between the external flange portions 6a of the electroconductive needle members 6 in a compressed state under a prescribed pre-load so that the electroconductive needle members 6 are resiliently urged in the projecting direction away from each other. The external flange portions 6a are engaged by retaining shoulders 9, where the plate members 1 and 4 are exposed to the interior of the coil spring support holes 2a and 3a, respectively, defined by the coil spring support holes 2a and 3a and the needle member guide holes 1a and 4a having different diameters. The tip portion 6b is brought into contact with an object to be contacted such as a terminal for testing or measuring purposes.

In the electroconductive contact unit having the above described structure, one or both of the outer plate members 1 and 4 formed with the needle member guide holes 1a and 4a, on which the positional accuracy of the electroconductive needle members 6 depend, are made of metallic material such as brass. If the plate members are made of plastic material, the positional accuracy may be compromised due to the lack of mechanical strength and/or degradation over time. However, by using metallic material, such a problem can be eliminated. A metallic material typically has a lower coefficient of thermal expansion than a plastic material, and is therefore more desirable when the environmental changes are taken into account.

When the electroconductive needle members 6 are desired to be supported by the needle member guide holes 1a and 4a at high precision as is the case with the illustrated embodiment, because the coil spring support holes 2a and 3a are not required to be formed at any high precision, these plate members 2 and 3 can be made of plastic material, and the process of forming the coil spring support holes can be simplified. When the mechanical strength of the entire unit is desired to be increased, the middle plate members 2 and 3 may also be made of metallic material. The metallic material is not limited to brass, but may also consist of aluminum or stainless steel in view of workability, corrosion resistance and material cost.

If any one of the plate members 1 to 4 is made of metallic material, because a readily available metallic member is typically a good electric conductor, an insulating film should be formed on the surface of the corresponding metallic plate member by a film forming process such as CVD. The insulating film may consist of plastic materials such as polyimide, glass materials such as $SiO_2$, ceramic materials such as $Al_2O_3$, or metal oxides.

The forming process of the insulating film may include CVD, electro-deposition, oxidization and vapor deposition among other possibilities. For instance, an insulating film of polyimide may be placed on a brass plate by electro-deposition, an insulating film may be formed on an aluminum plate by anodizing, an insulating film of polyimide may be placed on a stainless steel plate by electro-deposition, or an insulating film of $SiO_2$ may be placed over a brass plate by CVD. An insulating film of glass, ceramic and metal oxide materials can be formed by CVD or vapor deposition, and an insulating film of metal oxides can be formed by oxidization.

Figure 2:
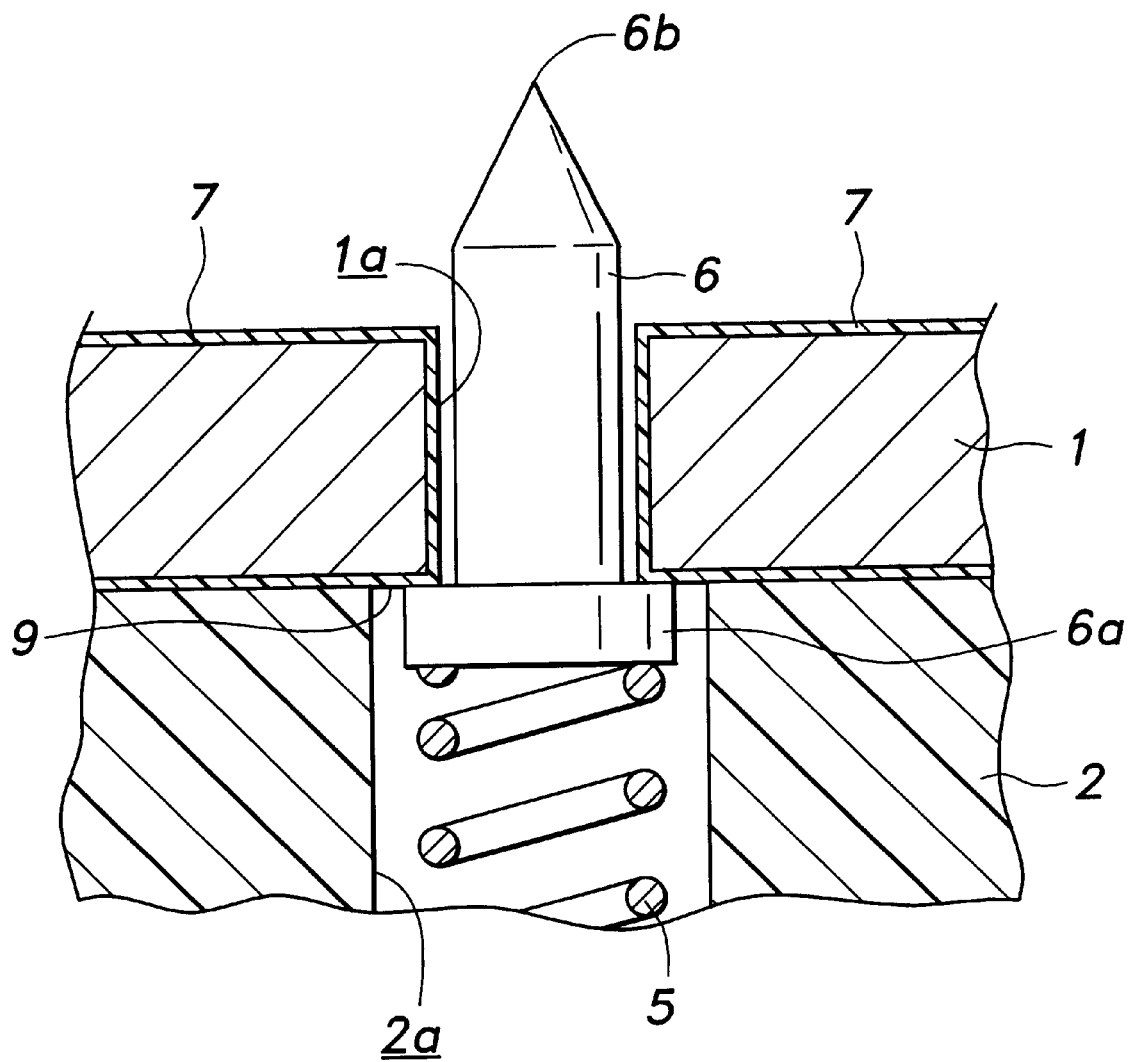
FIG. 2 is an enlarged vertical sectional view of an essential part of the electroconductive contact unit embodying the present invention.

In the illustrated embodiment, as shown in FIG. 2, an insulating film 7 is formed over the surface of each plate member 1 or 4 provided with the needle member guide hole 1a or 4a. Therefore, even though the plate member 1 or 4 is made of electroconductive metallic material, there will be no electric short-circuiting between the electroconductive needle member 6 and the plate member 1 or 4. The remaining plate members 2 and 3 may also be made of metallic material. In such a case, an insulating film 7 is formed on the inner circumferential surfaces of the coil spring support holes 2a and 3a as well as those of the needle member guide holes 1a and 4a so that the necessary insulation for the electroconductive needle members 6 and compression coil spring 5 can be ensured.

There is a significant gap between the outer circumferential surface of each electroconductive needle member 6 and the inner circumferential surface of the corresponding needle member guide hole 1a or 4a in the illustrated embodiment, but it is so only because of the schematic nature of the drawing, and the gap in the actual contact unit is desired to be as small as possible in view of the purpose of the present invention which is to improve the positional precision of the needle tip portion 6b of each electroconductive needle member 6. Even when the gap is relatively large, the positional precision of the needle tip portion 6b of each electroconductive needle member 6 can be accomplished by making the outer diameter of the external flange portion 6a to be substantially identical to the inner diameter of the coil spring support hole 2a or 3a so that the external flange portion 6a may be guided by the coil spring support hole 2a or 3a.

By thus forming the plate members with metallic material, the mechanical strength of the assembly can be substantially increased as compared to the conventional assembly using plate members made of plastic material, and this allows the thickness of the plate members to be reduced, and the entire assembly to have a lower profile. This in turn reduces the length of the path of electric conduction between the two electroconductive needle members 6, and improves the electric properties such as resistance and inductance.

Figure 3:
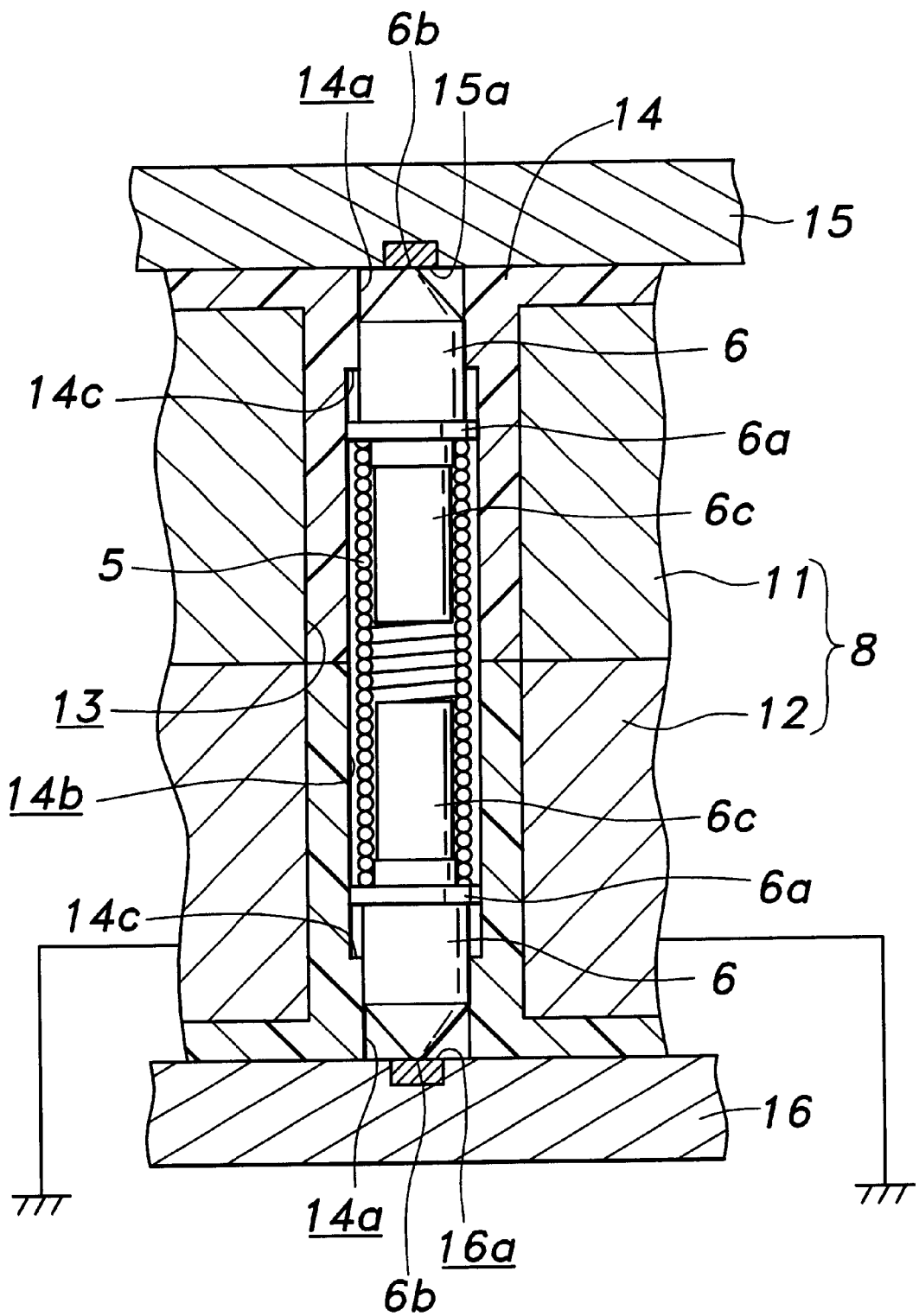
FIG. 3 is a partly broken-away fragmentary vertical sectional view of a second embodiment of the present invention.

FIG. 3 shows a second embodiment of the present invention. The parts corresponding to those of the previous embodiment are denoted with like numerals without describing them anew. In this embodiment, a support block 8 is formed by laminating a pair of electroconductive metallic plate members 11 and 12 one over the other, and one of the plate members 12 is grounded. A through hole 13 is passed through the plate members 12 and 11 across their thickness as a straight hole, and an insulating film 14 is formed over the inner circumferential surface of the through hole 13 and the outer surfaces (the upper and lower ends surfaces in the drawing) of the two metallic plate members 11 and 12 all in a continuous manner. The materials for the plate members 11 and 12 and the insulating film 14 may be selected in a similar fashion as in the previous embodiment.

In this embodiment, because the entire inner circumferential surface of the through hole 13 is formed with the insulating film 14, both the needle member guide hole 14a and the coil spring support hole 14b are defined by the insulating film 14. A compression coil spring 5 is coaxially received in the coil spring support hole 14b, and a pair of electroconductive needle members 6 are provided on either coil end of the compression coil spring 5.

Each electroconductive needle member 6 of the illustrated embodiment is similar to those of the previous embodiment as far as the shape of the part extending from the external flange portion 6a and the needle tip portion 6b is concerned, but the end of the external flange portion 6a facing away from the needle tip portion 6b is provided with a boss portion 6c projecting integrally therefrom. The boss portion 6c is fitted into the corresponding coil end of the compression coil spring 5, and the somewhat enlarged base end (adjacent to the flange portion 6b) of the boss portion 6c is press fitted into the coil end so that the two coil ends of the compression coil spring 5 are connected to the corresponding electroconductive needle members 6.

Similarly as the previous embodiment, the needle member guide hole 14a has a smaller diameter than the coil spring support hole 14b, and the inner diameter of the needle member guide hole 14a is larger than the outer diameter of the needle portion of the electroconductive needle members 6 but smaller than the outer diameter of the external flange portion 6a. Therefore, a shoulder 14c consisting of a part of the insulating film 14 is defined in each stepped portion between the parts of the two holes 14a and 14b having different diameters, and this shoulder 14c engages the external flange portion 6a so as to prevent the electroconductive needle member 6 from coming entirely out of the through hole 13. Each electroconductive needle member 14 is slidably supported by the needle member guide hole 14a, and the external flange portion 6a may also be slidably received by the coil spring support hole 14b.

In the drawing, the two electroconductive needle members 6 are brought into contact with terminals 15a and 16a of the object 15 to be tested and the tester 16, respectively.

In the electroconductive contact unit described above, because the plate members 11 and 12 are both conductors and grounded which are covered by an insulating film, the needle members 6 and the compression coil spring 5 are electromagnetically shielded by the plate members 11 and 12 which are at the ground level voltage, and are therefore protected from external noises.

When testing chips for high frequency applications, high frequency signals are conducted through the electroconductive contact unit, and this could cause noises to be produced. However, this arrangement prevents spurious electromagentic radiations from affecting external circuits.

By adjusting the material and thickness of the insulating film 14, the impedance of the contact unit can be matched with that of the equipment to be tested.

Four plate members 1 to 4 were laminated in the embodiment illustrated in FIG. 1, but the assembly may also consist of a single plate member, and the present invention is not limited by the number of plate members. The material of the plate members may consist of any material which increases the mechanical strength, and a similar advantage can be achieved even when the plate members are made of other electroconductive materials such as silicon as well as common metallic members.

Figure 4:
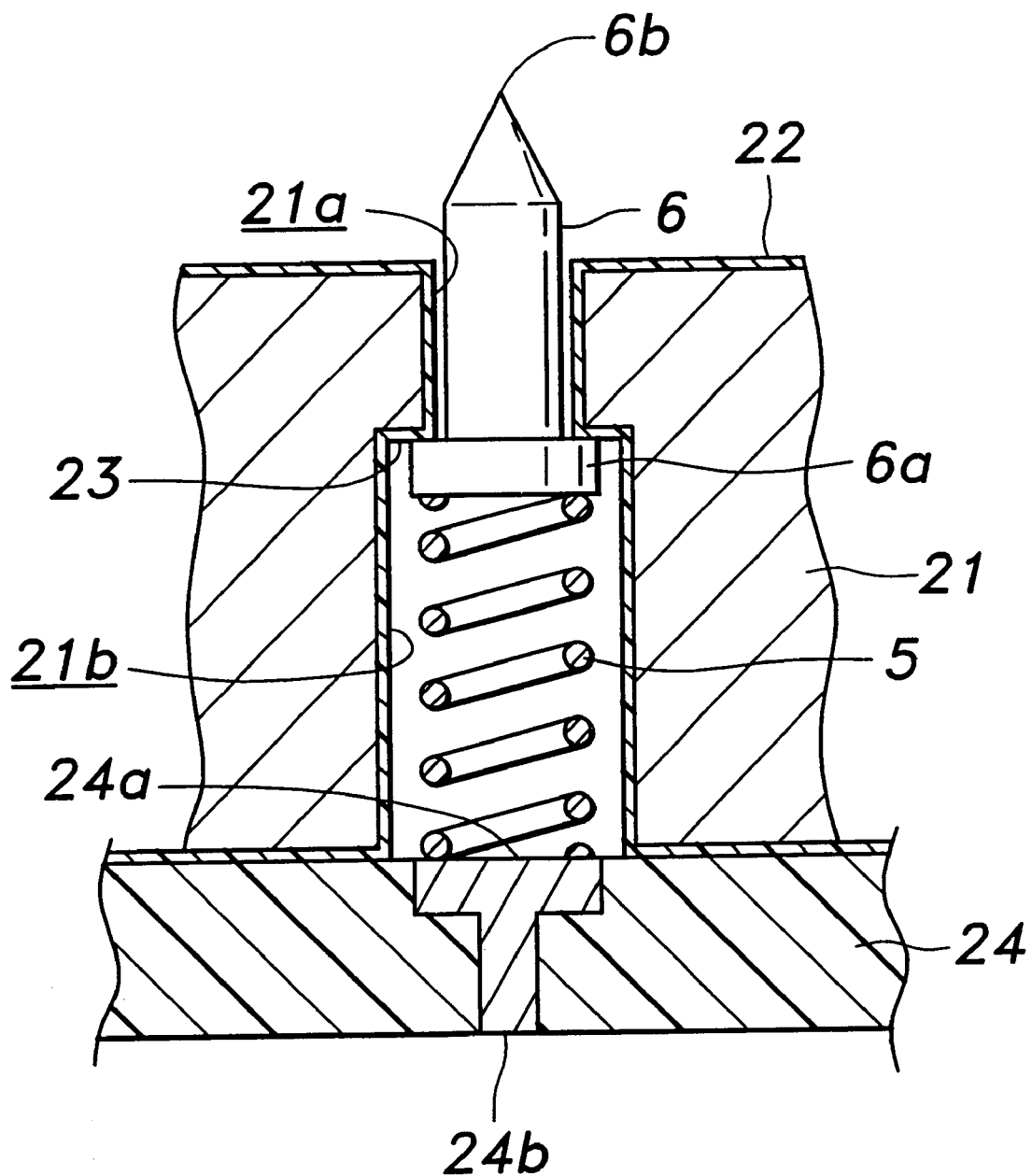
FIG. 4 is a view similar to FIG. 1 showing a third embodiment of the present invention.

FIG. 4 shows a third embodiment of the present invention which is based on a single plate member structure. The parts corresponding to those of the previous embodiments are denoted with like numerals without describing them anew. In this embodiment, a needle member guide hole 21a having a relatively small diameter and a coil spring support hole 21b having a relatively large diameter are coaxially formed in a single plate member 21 as a through hole. The needle member guide hole 21a opens on one side of the plate member 21 (upper surface in the drawing), and the coil spring support hole 21b opens on the other side of the plate member 21 (lower surface in the drawing).

An insulating film 22 is formed on the inner circumferential surfaces of the holes 21a and 21b and the outer surfaces (upper and lower surfaces in the drawing) of the plate member 21. Thus, the inner circumferential surfaces of the holes 21a and 21b are defined by the insulating film 22. A retaining shoulder 23 is defined between the needle guide hole 21a and the coil spring support hole 21b having different diameters.

The needle portion of the electroconductive needle member 6 is axially slidably guided by the needle member guide hole 21a, and the external flange portion 6a of the electroconductive needle member 6 is received in the coil spring support hole 21b. The coil spring support hole 21b coaxially receives a compression coil spring 5 which abuts the external flange portion 6a and resiliently urges the electroconductive needle member 6 in the direction to project the needle tip portion 6b thereof. The retaining shoulder 23 engages the external flange portion 6a so as to define the projecting length of the electroconductive needle member 6.

A base board 24 is integrally attached to the lower surface of the plate member 21 as shown in the drawing, and the opening of the coil spring support hole 21b facing away from the electroconductive needle member 6 is closed by the base board 24. The part of the base board 24 which is exposed to the interior of the coil spring support hole 21b is provided with a terminal 24a which engages a coil end of the compression coil spring 5. The terminal 24a is connected to an external circuit via a circuit pattern 24b formed on the base board 24. Therefore, in this embodiment, the electroconductive needle member 6 is electrically connected to the terminal 24a via the compression coil spring 5.

The third embodiment provides similar advantages as those of the previous embodiments. In other words, because the plate member 21 is made of electroconductive metal, the positional precision of the needle tip portion 6a can be ensured owing to the high mechanical strength of the plate member 21, and a favorable noise prevention can be achieved owing to the electromagnetic shielding of the electroconductive needle member 6 and the compression coil spring 5 by the electroconductive material of the plate member 21. This embodiment consists of an electroconductive contact unit having a single moveable end which has an electroconductive needle member only on one end of the compression coil spring 5, and provides the advantage of simplicity when the both ends are not required to be moveable.

Thus, according to the present invention, by using plate members made of metallic material having a high mechanical strength, the plate members are prevented from warping even when subjected to changes in the environmental conditions or degradation due to aging, and the positional accuracy of the electroconductive needle member can be ensured. Owing to an improved mechanical strength of the metallic plate members as compared with the plate members made of plastic material, a highly low-profile design of the assembly is made possible. Even though the plate members are made of electroconductive metallic material, by forming an insulating film in the part of the through hole which makes a sliding contact with the electroconductive needle member, the required insulation can be achieved without any problem.

Because the plate members are made of electroconductive material, and an insulating film is formed at least over the inner circumferential surface of the through hole, the electroconductive needle member and compression coil spring received in the through hole can be electromagnetically shielded by grounding the plate members, and protected from the influences of noises. Furthermore, by forming an insulating film over the outer surface of the plate members, the influences of noises can be reduced even further, and the contact unit is made even more suitable for use as a high frequency probe.

What is claimed is:

1. An electroconductive contact unit assembly, comprising a holder for guiding an electroconductive needle member for contacting an object so as to be axially moveable into and out of a through hole, and a compression coil spring received in the through hole coaxially with respect to the electroconductive needle member so as to resiliently urge the electroconductive needle member out of the through hole, characterized by that:

the holder comprises an electroconductive metallic plate member and an insulating plate member placed one over the other; and the through hole comprises a needle member guide hole for guiding the electroconductive needle member, a retaining shoulder for retaining the electroconductive needle member therein against a spring force of the compression coil spring, and a coil spring support hole for receiving the compression coil spring;

the needle member guide hole and retaining shoulder being formed in the electroconductive metallic plate member, an insulating film being formed on an inner circumferential surface of the needle guide hole and retaining shoulder, and the coil spring support hole being formed in the insulating plate member.

2. An electroconductive contact unit assembly according to claim 1, wherein only one electroconductive needle member is provided on one end of the compression coil spring for each contact unit, and the electroconductive metallic plate member is provided only on one side of the insulating plate member.

3. An electroconductive contact unit assembly according to claim 1, wherein a pair of electroconductive needle member are provided each on the corresponding end of the compression coil spring for each contact unit, and the electroconductive plate member is provided on each side of the insulating plate member.

4. An electroconductive contact unit assembly according to claim 1, wherein the insulating film is formed on a surface of the electroconductive metallic plate member.

5. An electroconductive contact unit assembly according to claim 4, wherein the insulating film is formed on the outer surface of the electroconductive metallic plate member.

6. An electroconductive contact unit assembly according to claim 4, wherein the coil spring support hole is formed in the electroconductive metallic plate member.

7. An electroconductive contact unit assembly, comprising a holder for guiding an electroconductive needle member for contacting an object so as to be axially moveable into and out of a through hole, and a compression coil spring received in the through hole coaxially with respect to the electroconductive needle member so as to resiliently urge the electroconductive needle member out of the through hole, characterized by that:

the holder comprises an electroconductive metallic plate member; and the through hole is formed in the electroconductive metallic plate member and is in turn formed with an insulating film over an inner circumferential surface thereof;

the insulating film defining a needle member guide hole for guiding the electroconductive needle member, a retaining shoulder for retaining the electroconductive needle member against the resilient spring force, and a coil spring support hole for receiving the compression coil spring.

8. An electroconductive contact unit assembly, comprising a holder for guiding an electroconductive needle member for contacting an object so as to be axially moveable into and out of a through hole, and a compression coil spring received in the through hole coaxially with respect to the electroconductive needle member so as to resiliently urge the electroconductive needle member out of the through hole, characterized by that:

the holder comprises an electroconductive metallic plate member; and the through hole is formed in the electroconductive metallic plate member to define a needle member guide hole for guiding the electroconductive needle member, a retaining shoulder for retaining the electroconductive needle member against the resilient spring force, and a coil spring support hole for receiving the compression coil spring;

the through hole being formed with an insulating film over an inner circumferential surface thereof.

* * * * *